United States Patent
Schoor

(10) Patent No.: US 7,268,468 B2
(45) Date of Patent: Sep. 11, 2007

(54) PIEZOELECTRIC ACTUATOR AND A METHOD FOR PRODUCING IT

(75) Inventor: Ulrich Schoor, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/538,914

(22) PCT Filed: Jun. 26, 2003

(86) PCT No.: PCT/DE03/02130

§ 371 (c)(1),
(2), (4) Date: Jun. 13, 2005

(87) PCT Pub. No.: WO2004/055913

PCT Pub. Date: Jul. 1, 2004

(65) Prior Publication Data

US 2006/0113871 A1     Jun. 1, 2006

(30) Foreign Application Priority Data

Dec. 13, 2002   (DE) ............................... 102 58 255

(51) Int. Cl.
*H01L 41/053* (2006.01)
*H01L 41/083* (2006.01)
(52) U.S. Cl. ...................................... 310/328; 310/340
(58) Field of Classification Search ................ 310/328, 310/340, 365, 366
See application file for complete search history.

(56) References Cited

U.S. PATENT DOCUMENTS

| 5,252,883 | A | * | 10/1993 | Kondo | ........................ 310/328 |
| 5,438,232 | A | | 8/1995 | Inoue et al. | |
| 5,475,278 | A | | 12/1995 | Inagawa et al. | |
| 6,661,158 | B2 | * | 12/2003 | Kawazoe | ..................... 310/328 |
| 6,956,166 | B2 | * | 10/2005 | Kishimoto | .................. 174/52.4 |
| 2001/0009344 | A1 | | 7/2001 | Furukawa et al. | |
| 2002/0084872 | A1 | | 7/2002 | Kawazoe | |

FOREIGN PATENT DOCUMENTS

| DE | 42 01 937 A1 | 7/1992 |
| DE | 199 28 190 A1 | 1/2001 |
| DE | 101 63 005 A1 | 10/2002 |
| EP | 0 509 488 A1 | 10/1992 |
| EP | 1 107 325 A2 | 6/2001 |
| JP | 3-72684 | 3/1991 |
| JP | 10-244222 | 9/1998 |

* cited by examiner

*Primary Examiner*—Darren Schuberg
*Assistant Examiner*—Derek Rosenau
(74) *Attorney, Agent, or Firm*—Ronald E. Greigg

(57) ABSTRACT

A piezoelectric actuator is proposed, for example for actuating a mechanical component, and has a multilayered structure of piezoelectric layers with inner electrodes interspersed between them. The inner electrodes contact the outer electrodes on alternating sides and the regions between the outer electrodes are provided with a suitable insulation. The insulation is a layer comprised of a band, for example an adhesive tape, which covers over a predetermined region between the outer electrodes. The adhesive tape is comprised of a precisely measured, prefabricated material and can be stuck, rolled, melted, vulcanized, or sintered in place in a bubble-free manner.

19 Claims, 1 Drawing Sheet

PIEZOELECTRIC ACTUATOR AND A METHOD FOR PRODUCING IT

CROSS-REFERENCE TO RELATED APPLICATIONS

This application is a 35 USC 371 application of PCT/DE 03/02130 filed on Jun. 26, 2003.

BACKGROUND OF THE INVENTION

1. Field of the Invention

The invention relates to an improved piezoelectric actuator useful, for example, for actuating a mechanical component such as a valve or the like.

It is generally known that the so-called piezoelectric effect can be used to produce a piezoelectric element partly comprised of ceramic material with a suitable crystalline structure. When an external electrical voltage is applied, a mechanical reaction of the piezoelectric element occurs, which produces a pressure or tension in a direction that can be predetermined as a function of the crystalline structure and the regions to which the electrical voltage is applied.

2. Description of the Prior Art

The structure of these piezoelectric actuators can be laid out in a number of layers, in the form of so-called multilayered piezoelectric actuators in which the layers are respectively interspersed with the inner electrodes used to apply the electrical voltage. To this end, piezoelectric sheets are produced and stacked in alternation with printed electrode surfaces that serve as inner electrodes. In this case, a sheet has its connection only on a connection side and on the opposite side, must have an edge without an electrode and this edge must be provided with an insulating space. Then the two sides are connected on the outside by means of outer electrodes. The piezoelectric actuator is thus produced in a known way with a number of plates, much like a capacitor.

Such multilayered piezoelectric actuators are operated with field intensities that require an insulation of the open leakage paths in the outer piezoelectric ceramic between the potentials of the outer electrodes. Suitable lacquers or insulating materials with favorable adhesion and favorable breakdown and insulation characteristics can, for example, be applied over a general area in an intrinsically known way, using proven methods that involve spraying or immersion.

Piezoelectric actuators of this kind are known, for example, from DE 199 28 190 A1, in which the outer electrodes are strengthened with reinforcing materials such as corrugated sheets or gratings and are provided for connecting inner electrodes to connections.

In order to assure a reliable manufacturing process in mass production, it is important to prevent contamination of the contact zones for the connection of outer electrodes, e.g. by means of welding or soldering. An above-described application of lacquer, however, may possibly lead to a contamination of the tools used in the connecting process. The required contaminant-free contact points, however, can only be achieved with difficulty, by removing lacquer and lacquer residues.

DE 199 28 180 A1 has also disclosed that in the region between the contacts of the outer electrodes, the piezoelectric layers are recessed toward the inside by a predetermined amount to form a groove. During machining of the piezoelectric actuator surface and during attachment of the outer electrodes, this groove prevents the electrode material between the outer electrodes from becoming smeared and therefore results in a significant improvement in the resistance of the piezoelectric actuator to insulation breakthroughs.

SUMMARY AND ADVANTAGES OF THE INVENTION

The piezoelectric actuator described at the beginning, which can be used, for example, to actuate a mechanical component, is composed of a multilayered structure of piezoelectric layers interspersed with inner electrodes. The inner electrodes contact outer electrodes on alternating sides, the regions between the outer electrodes being provided with a suitable insulation. According to the invention, the insulation is advantageously constituted by a layer of favorably adhesive band, preferably an adhesive tape, which covers over a predetermined region between the outer electrodes, the adhesive layer simultaneously constituting the insulation layer.

The band or also a so-called tape can, for example, be comprised of a prefabricated, precisely measured material and can be stuck on or rolled on in a bubble-free manner according to a particularly advantageous production method, or can be applied in a bubble-free manner by being melted, vulcanized, or sintered in place. Consequently, the regions to be insulated can be easily produced without the contact zones for the outer electrodes being insulated at all.

Particular advantages of the invention include a uniform layer thickness even at the edges as opposed to the extremely thin layers at the edges produced with the customary lacquer. In addition, fewer work steps are required to produce the insulation since it is no longer necessary to mask the end surface and contact regions or to clean the contact zones for the outer electrodes. This also makes it possible to significantly shorten the processing time because the previously customary lacquering also required drying and hardening time. The dry application of the adhesive tape according to the invention occurs in a precisely measured, prefabricated way and produces immediately processable piezoelectric actuators without indentations.

A tape or band with a favorable adhesion and with suitable insulation properties can, as mentioned above, be applied in a bubble-free manner by being stuck, rolled, melted, or sintered in place; it is also possible to use a combination of several of the above-mentioned methods.

For example, a bubble-free rolling onto the flat surface and the possible addition, particularly at the edges, of directed heat and pressure or rolling can produce a complete coverage and, in the next step, a shaping of the tolerance-encumbered layer of a possibly sharp edge can be carried out, with the aim of covering the edge in a precisely fitting manner, without tension in the sheet. This can be achieved advantageously, possibly through local heating of the adhesive tape so as to produce a durable, high-quality, bubble-free adhesion as well as a leakage path-inhibiting coverage of the piezoelectric actuators.

The adhesive tape can be simply supplied in the form of a strip on a roll and then be cut to length before or during application onto the piezoelectric actuator.

BRIEF DESCRIPTION OF THE DRAWINGS

An exemplary embodiment of the piezoelectric actuator according to the invention will be explained in detail herein below, in conjunction with the drawings in which.

DESCRIPTION OF THE PREFERRED EMBODIMENT

Figure 1:
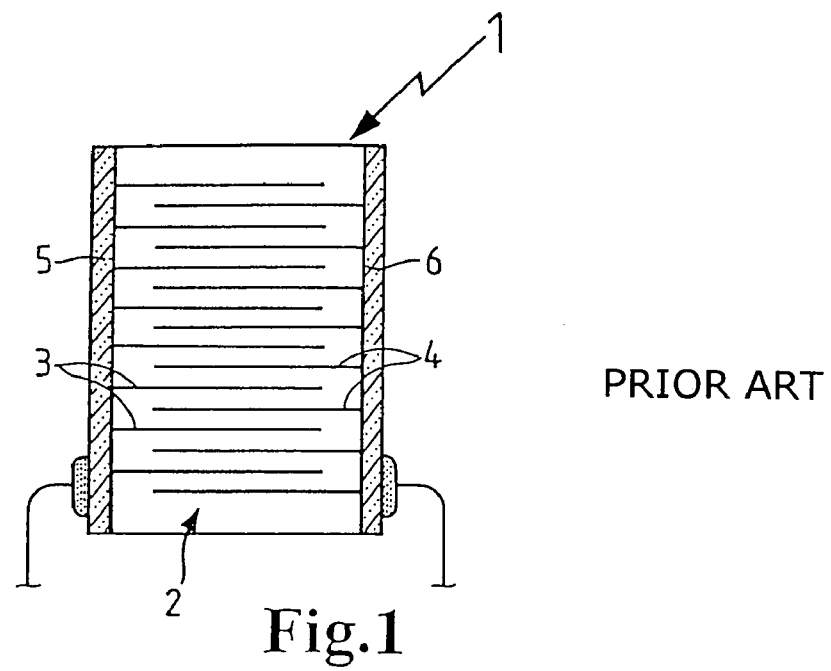
FIG. 1 shows a cross section through a piezoelectric actuator with a multilayered structure comprised of layers of piezoelectric ceramic and electrodes according to the prior art.

FIG. 1 schematically depicts a piezoelectric actuator 1 according to the prior art, which is comprised in an intrinsically known way of piezoelectric sheets 2 of a quartz material with a suitable crystalline structure so that by making use of the so-called piezoelectric effect, the application of an external electric voltage to inner electrodes 3 and 4 via contact surfaces and/or outer electrodes 5 and 6 triggers a mechanical reaction of the piezoelectric actuator 1.

Figure 2:
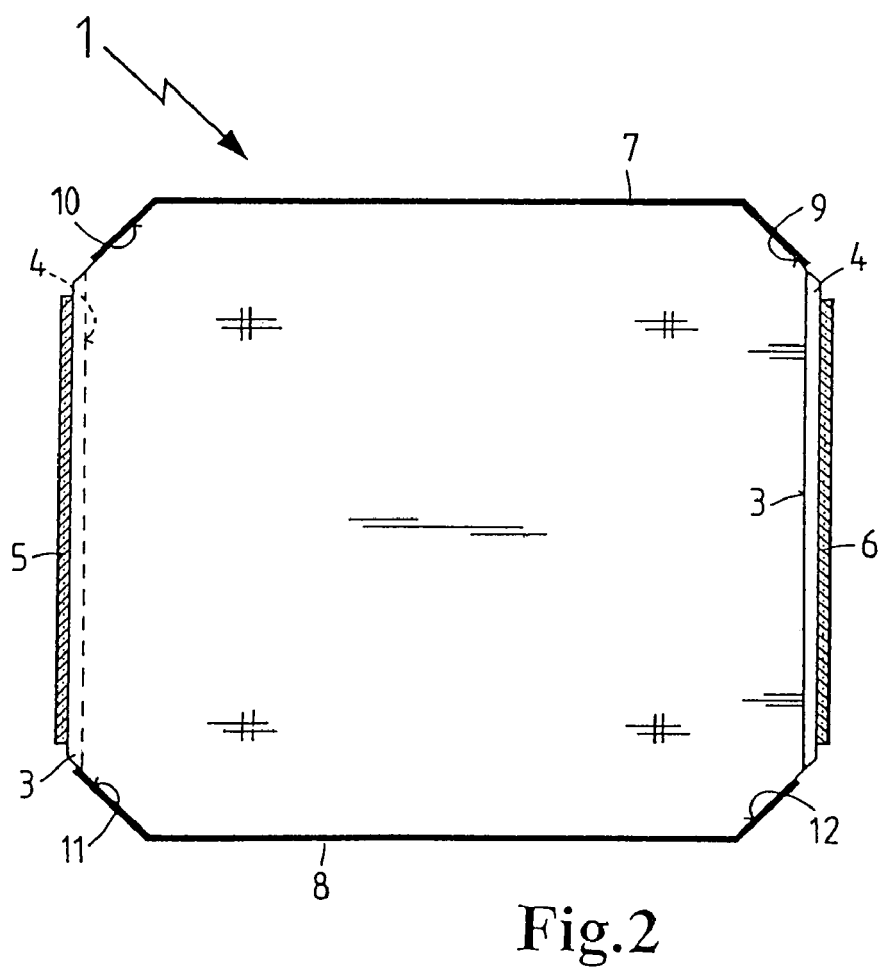
FIG. 2 is a top view of the layer structure of one of the inner electrodes according to FIG. 1, with an adhesive tape serving as an insulation layer.

FIG. 2 is a top view of an inner electrode 3 and another inner electrode 4 depicted with a dashed line, in which it is clear that the inner electrode 3 is connected to the outer electrode 5 on the left side and the other inner electrode 4 is connected to the outer electrode 6 on the right side. According to the invention, an adhesive tape 7 is applied to the one side of the piezoelectric actuator 1 and an adhesive tape 8 is applied to the other side.

The adhesive tapes 7 and 8 can be applied to the lateral surfaces of the piezoelectric actuator 1 by means of bubble-free rolling and in particular, possibly by means of directed heat and pressure or rolling at the edges 9, 10, 11, and 12. This achieves a complete coverage of the regions of the piezoelectric actuator 1 not provided with the external electrodes 5 and 6 so that the adhesive tapes 7 and 8 cover the edges 9 to 12 in a precisely fitting, tension-free manner. This can also be supplemented by an appropriate local heating of the respective adhesive tape 7 or 8 at the edges 9 to 12.

The foregoing relates to preferred exemplary embodiments of the invention, it being understood that other variants and embodiments thereof are possible within the spirit and scope of the invention, the latter being defined by the appended claims.

The invention claimed is:

1. A piezoelectric actuator comprising
a multilayered structure of piezoelectric layers (2) with inner electrodes (3, 4) interspersed between the piezoelectric layers, and
outer electrodes (5, 6) and
layers of an adhesive band of insulating material contacting the inner electrodes (3, 4) on alternating sides, wherein the regions between the outer electrodes (5, 6) are provided with a suitable insulation (7, 8),
the insulation being a layer covering only precisely the region between the outer electrodes (5, 6), wherein the insulation (7,8) is applied in a tension-free manner exactly in the region between the outer electrodes (5,6) and covering at least one edge of the piezoelectric actuator with constant thickness.

2. The piezoelectric actuator according to claim 1, wherein the adhesive band is an adhesive tape (7, 8).

3. The piezoelectric actuator according to claim 1, wherein the band or adhesive tape (7, 8) is comprised of a precisely measured, prefabricated material.

4. The piezoelectric actuator according to claim 2, wherein the band or adhesive tape (7, 8) is comprised of a precisely measured, prefabricated material.

5. A method for producing a piezoelectric actuator according to claim 1, the method comprising sticking or rolling the band (7, 8) in place in a bubble-free manner.

6. A method for producing a piezoelectric actuator according to claim 2, the method comprising sticking or rolling the band (7, 8) in place in a bubble-free manner.

7. A method for producing a piezoelectric actuator according to claim 3, the method comprising sticking or rolling the band (7, 8) in place in a bubble-free manner.

8. The method for producing a piezoelectric actuator according to claim 2, comprising the step of
melting vulcanizing or sintering the band (7, 8) in place in a bubble-free manner.

9. The method for producing a piezoelectric actuator according to claim 3, comprising the step of
melting vulcanizing or sintering the band (7, 8) in place in a bubble-free manner.

10. The method according to claim 5, wherein the band (7, 8) is applied through local or general area heating and/or pressure or rolling.

11. The method according to claim 10, wherein the layers (2) have shaped corners or edges (9, 10, 11, 12) provided by a shaping procedure at least at the corners or edges (9, 10, 11, 12) of the piezoelectric actuator (1).

12. The method according to claim 5, wherein the band (7, 8) is supplied in the form of a strip on a roll and is cut to length before or during application onto the piezoelectric actuator (1).

13. The method according to claim 10, wherein the band (7, 8) is supplied in the form of a strip on a roll and is cut to length before or during application onto the piezoelectric actuator (1).

14. The method according to claim 11, wherein the band (7, 8) is supplied in the form of a strip on a roll and is cut to length before or during application onto the piezoelectric actuator (1).

15. A method for producing a piezoelectric actuator having
a multilayered structure of piezoelectric layers (2) with inner electrodes (3, 4) interspersed between the piezoelectric layers, and
outer electrodes (5, 6) and
layers of an adhesive band of insulating material contacting the inner electrodes (3, 4) on alternating sides, wherein the regions between the outer electrodes (5, 6) are provided with a suitable insulation (7, 8),
the insulation being a layer covering only precisely the region between the outer electrodes (5, 6), and in a tension free manner, the method comprising the step of melting, vulcanizing, or sintering the band (7, 8) in place in a bubble-free manner.

16. The method according to claim 15, wherein the band (7, 8) is applied through local or general area heating and/or pressure or rolling.

17. The method according to claim 16, wherein the layers (2) have shaped corners or edges (9, 10, 11, 12) provided by a shaping procedure at least at the corners or edges (9, 10, 11, 12) of the piezoelectric actuator (1).

18. The method according to claim 15, wherein the band (7, 8) is supplied in the form of a strip on a roll and is cut to length before or during application onto the piezoelectric actuator (1).

19. A piezoelectric actuator comprising
a multilayered structure of piezoelectric layers (2) with inner electrodes (3, 4) interspersed between the piezoelectric layers, and outer electrodes (5, 6) and
layers of an adhesive band of insulating material contacting the inner electrodes (3, 4) on alternating sides, wherein the regions between the outer electrodes (5, 6) are provided with a suitable insulation (7, 8),
the insulation being a layer covering only precisely the region between the outer electrodes (5, 6), wherein the insulation (7,8) is applied in a tension-free manner exactly in the region between the outer electrodes (5,6) and covering with a uniform layer thickness, including the same uniform layer thickness at least one edge of the piezo electric actuator.

* * * * *